United States Patent [19]

Babini

[11] Patent Number: 5,007,946
[45] Date of Patent: Apr. 16, 1991

[54] GRATING AND DUST-FILTER UNIT FOR CLOSING THE VENTILATING HOLE OF ELECTRONIC EQUIPMENT, WITH PROTECTIVE DEVICE AGAINST ELECTROMAGNETIC AND ELECTROSTATIC INTERFERENCE

[75] Inventor: Ezio Babini, Bologna, Italy

[73] Assignee: Fittings for Industry S.R.L., Bologna Via Di Corticella, Italy

[21] Appl. No.: 519,898

[22] Filed: May 7, 1990

[30] Foreign Application Priority Data

May 12, 1989 [IT] Italy ................................ 4808/89[U]

[51] Int. Cl.$^5$ ............................................. B01D 46/10
[52] U.S. Cl. ........................................ 55/501; 55/509; 360/97.02
[58] Field of Search ...................... 55/385.6, 495, 501, 55/509, 511; 360/97.02

[56] References Cited

U.S. PATENT DOCUMENTS 3,546,359 12/1970 Ciccarelli, W. et al. ............. 174/35
4,334,899 6/1982 McConnell ........................... 55/509
4,781,526 11/1988 Mead ..................................... 55/501

FOREIGN PATENT DOCUMENTS 0169598 1/1986 European Pat. Off. .

*Primary Examiner*—Bernard Nozick
*Attorney, Agent, or Firm*—Darby & Darby

[57] ABSTRACT

A grating is fastened to the housing of a computer by threaded nuts and screws, having a truncated-cone head and passing through holes made on the grating, on the housing, and on the frame of an aspirator, as well as through truncated-cone shaped bushings, which are provided with extensions turned towards the center of the grating, so to remain below a portion of a metal net placed over the screws and kept in place by a cover snap-locked to the grating, so that the net is electrically connected with the housing.

If the frame of the aspirator is made of plastic material, then an electric connector, is linked to one of the screw or nut, with a conductor connector with the housing.

3 Claims, 1 Drawing Sheet

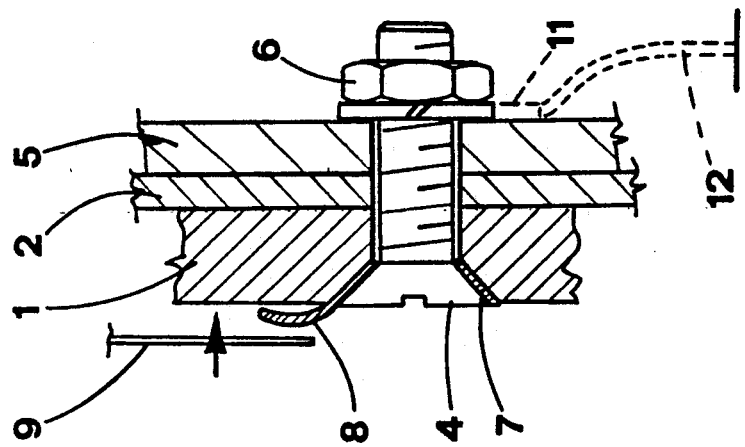
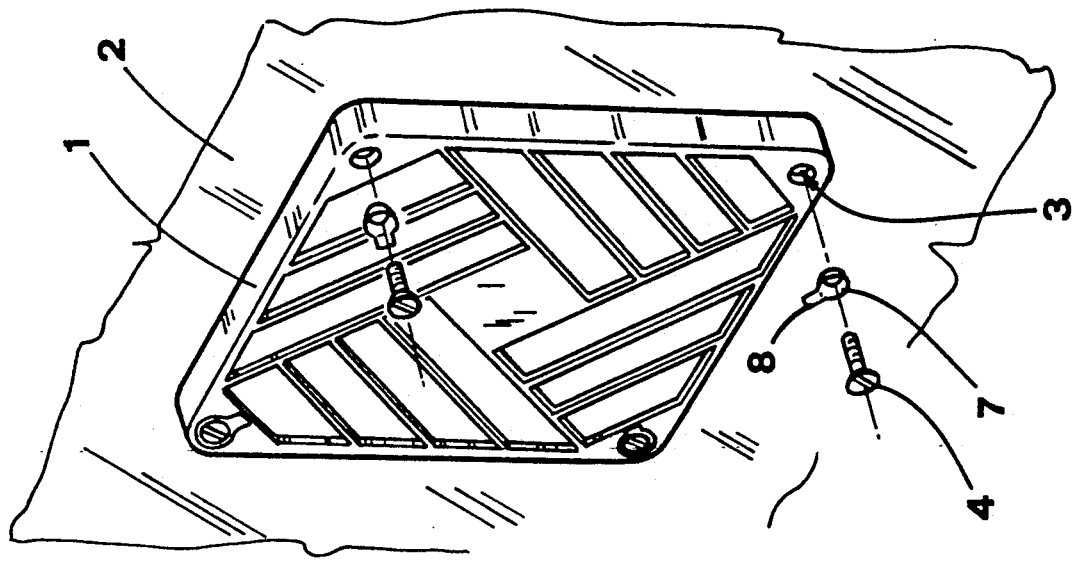
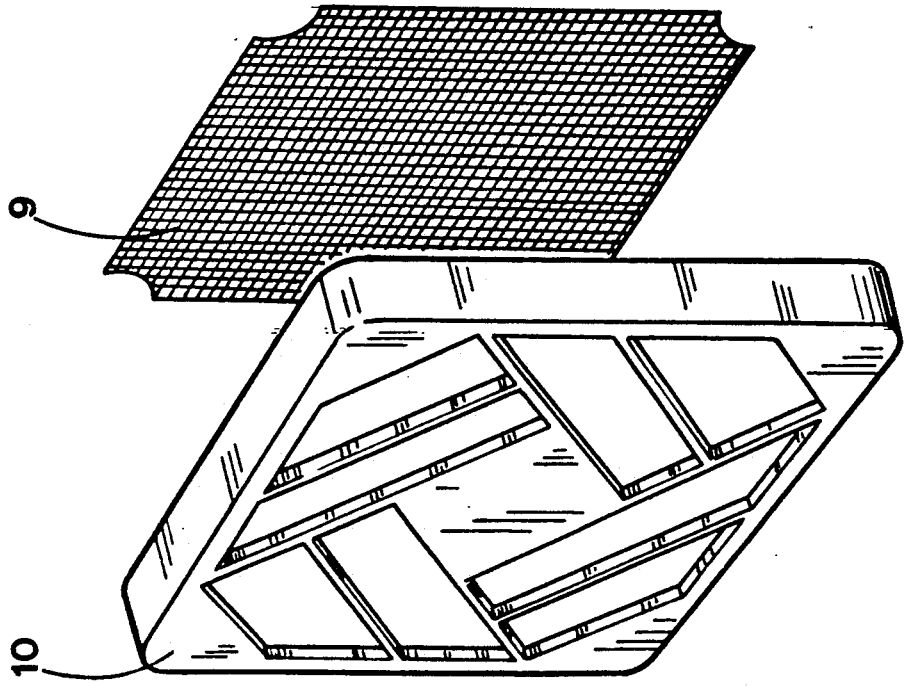

GRATING AND DUST-FILTER UNIT FOR CLOSING THE VENTILATING HOLE OF ELECTRONIC EQUIPMENT, WITH PROTECTIVE DEVICE AGAINST ELECTROMAGNETIC AND ELECTROSTATIC INTERFERENCE

BACKGROUND OF THE INVENTION

The invention relates to a grating and dust-filter unit for closing the ventilating hole of electronic equipment, provided with a protective device against electromagnetic and electrostatic interference.

DESCRIPTION OF THE PRIOR ART

It is known that electronic computers, as well as other similar electronic equipment, to work properly, require suitable cooling devices, in order to dissipate the thermal energy generated by some components of electric circuits when they are activated.

Generally, in correspondence with a hole made on the external housing of a computer, an aspirator is fitted, so that an air flow is caused to enter through the hole, to be ejected from other holes already existing or made for the purpose in the housing.

A finger-protective grating, whose features must be in accordance with the requirements of international regulations, is placed onto the hole, in order to prevent the accidental introduction of objects or operators' fingers during cleaning and maintenance operations, with the obvious and serious consequences which would arise in the case that the aspirator were working.

To avoid the penetration of dust into the housing, a net is fitted on the grating, being shaped so to provide a surface as wide as possible to be crossed by the air flow.

The nets, which may be made either of plastic (synthetic resins) or metal, are to be removed and cleaned at regular intervals, or replaced, to allow an efficient inner ventilation of the computer. A grating is known, which is composed of two elements allowing the net to be removed, but not leaving the air inlet free. It comprises the proper grating, which is fastened externally to the housing by using the same fastening means of the aspirator, which on the contrary remains inside the housing. A cover is put over the grating, and snap-locked to it. Between the grating and the cover, the net remains interposed, for whose cleaning it is just sufficient to remove the cover, that is easily done by acting manually, without tools of any kind, such as a screwdriver, while the grating always remains fastened to the housing, to carry out its protecting function.

Mounting metal nets connected to the computer housing would make it possible, as it is known, to achieve a shielding action against electromagnetic and electrostatic interference also in the suction-hole area. On the other hand, the plastic grating prevents the electric connection of the net with the housing.

In a known solution, a metal net is provided, supported by a small metal frame which is fastened directly onto the housing, by using the same fastening means of the aspirator. However, that solution presents a serious drawback, i.e. to remove the net, the aspirator must be absolutely released from the housing and then repositioned when the net is set back again on the hole.

Furthermore, the suction hole remains completely free while the net is cleaned.

Obviously, this requires the assistance of skilled staff, anyway the consequences and risks involved by the possibility of reaching the components of the aspirator, with the latter connected with the current input device, are self-evident.

SUMMARY OF THE INVENTION

The aim of this invention is to introduce a grating for closing the suction hole of electronic computers or other similar equipment, fitted with a metal net having the double function of a filter, against the penetration of dust into the computer housing, and of a shield against electromagnetic and electrostatic interference, which nevertheless can be removed quickly and easily, even by unskilled staff; all this is achieved through a technical solution which is inexpensive and easy to carry out.

Said aim is achieved through a grating and dust-filter unit for closing the ventilating hole of electronic equipment, with protective device against electromagnetic and electrostatic interference, said unit comprising a grating fastened to the housing of an electronic computer or other similar equipment, through locking means above which a metal net is placed, and kept in place by a cover suited to remain snap-locked to said grating.

The unit includes, for each locking means, a small bushing through which the same means is passing, so to remain electrically connected with it, the small bushing being provided with an extension turned towards the centre of said grating, so to remain below a corresponding portion of said net as well as to be electrically connected with it, so that said net results to be electrically connected with said housing, with the possibility to be detached from it and connected with it, respectively by being removed from it and being placed onto said grating.

Each of the locking means comprises a screw, having a truncated-cone head and passing through a countersunk hole made on said grating as well as through corresponding holes made on said housing and on the frame of an aspirator, and a threaded nut engaging with said screw to lock said grating, housing and frame, said small bushing having a truncated-cone shape so to be complementarily positioned between the head of said screw and the countersunk hole.

If the frame of the aspirator is made of plastic, the unit will comprise at least one electric connector, linked with at least one of the locking means, and from which a conductor is branching off, which is electrically connected with said housing.

BRIEF DESCRIPTION OF THE DRAWINGS

The features of the invention are pointed out in the following description, with reference to the drawing enclosed herewith, where:

FIG. 1 shows an exploded view of the grating made according to this invention.

FIG. 2 shows a sectional view of a detail of the above-mentioned technical solution.

DESCRIPTION OF THE PREFERRED EMBODIMENT

With reference to the above-mentioned figures, no. 1 indicates a grating of a known type, made in such a way as to be fastened to the outside of the housing of an electronic computer or other similar equipment, a small portion of which, indicated by no. 2, is illustrated in the enclosed drawings, and it is close to the suction hole.

Corresponding with each corner of the grating 1, a countersunk hole 3 is provided, suited to receive the truncated-cone head of a screw 4. Then, each screw 4 passes through the hole 3, and through corresponding holes made in the housing 2 and in the supporting frame 5 of an aspirator (not illustrated, since it is already known) to couple with a threaded nut 6.

In this way, the aspirator frame 5 and the grating 1 are correspondingly fastened to the housing 2 through the same fastening means, i.e. the screws 4. As it may well be seen from FIG. 1, between the head of the screw 4 and the countersunk hole 3, a truncated-cone metal bushing 7 is interposed, provided with an extension 8 starting from its edge having a greater diameter.

Once the nut 6 has been tightened, the unit seen in sectional view appears as it is illustrated in FIG. 2.

The small bushings 7 are oriented in such a way that the relative extensions 8 result to be turned towards the centre of the grating. Moreover, the extensions are slightly curved, so to remain raised from the surface of the grating 1 and to oppose a light upward elastic reaction on the net 9.

Upon the grating 1 a net 9 is positioned, its corners being shaped so to avoid interfering with screws 4, still remaining above the extensions 8, electrically connected with these latter. Finally, a cover 10 is placed onto the grating, and it is snap-locked to the same, so keeping the net 9 adherent to the grating 1 and electrically connected with the extensions 8.

Obviously, if the aspirator frame 5 is metal, i.e. conducting, the net turns out to be connected with the housing 2 through the extensions 8 connected with the small bushings 7 which are in contact with the screws 4 which are locking the frame 5 to the housing 2.

Alternatively, if the frame 5 is made of an insulating plastic matter, under at least one nut 6 a connector 11 is placed, from which a conductor 12 is branching off, connected with the housing 2 in a known way.

Thus the net can also carry out its shielding function against electromagnetic and electrostatic interference, since it is electrically connected with the housing 2 which, in its turn, is electrically connected with an earth plate. On the other hand, the net can be removed quickly and easily, by lifting the cover 10, without the grating 1 being detached from the housing 2.

The net 9 is quickly connected with and detached from the housing 2, without needing further operations, by virtue of the presence of the extensions 8 and of the small bushings 7. Furthermore, the solution presented turns out to be functional, although being inexpensive and easy to carry out.

It is understood that the above has been described by way of example and not as a limitation, therefore any possible variation of constructional details of this technical solution is to be considered as covered by the patent hereby applied for, as described above and according to the following claims.

What is claimed is:

1. A grating and dust-filter unit for closing a ventilating hole of electronic equipment, with protective device against electromagnetic and electrostatic interference, said unit comprising:

a grating fastened to the housing of an electronic computer, through locking means;

a metal net placed above said locking means and kept in place by a cover suited to remain snap-locked to said grating;

a small bushing, for each locking means, with said locking means passing through and being electrically connected with said bushing;

said small bushing being provided with an extension turned towards the centre of said grating, so to remain below a corresponding portion of said net as well as to be electrically connected with said net, so that said net results to be electrically connected with said housing, with possibility for said net to be detached from said housing and connected with said housing respectively by being removed therefrom and being placed thereon.

2. A unit as in claim 1, wherein each of said locking means comprises:

a screw, having a truncated-cone head and passing through a countersunk hole made on said grating, as well as through corresponding holes made on said housing and on the frame of an aspirator; and a threaded nut engaging with said screw to lock said grating, housing and frame, said small bushing having a truncated-cone shape so to be complementarily positioned between the head of said screw and the countersunk hole.

3. A unit as in claim 1, wherein at least one electric connector is linked to at least one of said locking means with a conductor branching off from said connector and connected with said housing.

* * * * *